(12) United States Patent
Dang

(10) Patent No.: US 10,498,129 B2
(45) Date of Patent: Dec. 3, 2019

(54) ELECTRICAL DEVICE WITH FAILURE MONITORING FUNCTION, ELECTRICAL SYSTEM AND TERMINAL DEVICE

(71) Applicant: Boe Technology Group Co., Ltd., Beijing (CN)

(72) Inventor: Wenting Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 336 days.

(21) Appl. No.: 15/329,357

(22) PCT Filed: Jul. 5, 2016

(86) PCT No.: PCT/CN2016/088586
§ 371 (c)(1),
(2) Date: Jan. 26, 2017

(87) PCT Pub. No.: WO2017/124701
PCT Pub. Date: Jul. 27, 2017

(65) Prior Publication Data
US 2018/0212415 A1 Jul. 26, 2018

(30) Foreign Application Priority Data
Jan. 18, 2016 (CN) .......................... 2016 1 0030684

(51) Int. Cl.
*H02H 1/00* (2006.01)
*G01K 3/00* (2006.01)
(Continued)

(52) U.S. Cl.
CPC ........... *H02H 1/0007* (2013.01); *G01K 3/005* (2013.01); *G01R 31/2825* (2013.01); *H02H 3/10* (2013.01); *H02H 5/04* (2013.01)

(58) Field of Classification Search
USPC .......................... 361/86–87, 93.7–93.9, 103
See application file for complete search history.

(56) References Cited

U.S. PATENT DOCUMENTS 5,095,453 A 3/1992 Pierson et al.
7,403,015 B2 * 7/2008 Carlino .................... H02H 1/06
324/424

(Continued)

FOREIGN PATENT DOCUMENTS

CN 103295275 9/2013
CN 103295275 A 9/2013
(Continued)

OTHER PUBLICATIONS

First Office Action from Chinese Application No. 201610030684.9 dated Jul. 3, 2017.
(Continued)

*Primary Examiner* — Danny Nguyen
(74) *Attorney, Agent, or Firm* — Calfee, Halter & Griswold LLP

(57) ABSTRACT

Embodiments of the present invention provide an electrical device, an electrical system and a corresponding terminal device. The electrical device comprises a sensing unit for sensing operational data of the electrical device during its operation, the operational data including at a voltage, a current for an electric component of the electrical device, a temperature of the electrical device during its operation, and combinations thereof. The electrical device further comprises a storage unit for storing the operational data so that a cause of failure is analyzed by means of the stored operational data when a failure occurs in the electrical device. The electrical device provided by embodiments of the invention can alleviate or mitigate the problem that that it is difficult in the prior art to determine the cause of failure after a failure occurs in the electrical device.

14 Claims, 2 Drawing Sheets

(51) Int. Cl.
    *G01R 31/28*    (2006.01)
    *H02H 3/10*     (2006.01)
    *H02H 5/04*     (2006.01)

(56)                    References Cited

U.S. PATENT DOCUMENTS

2008/0285197 A1*  11/2008  Nakamura ............. H02H 3/087
                                                         361/93.8
2015/0377949 A1*  12/2015  Ramirez .............. G01R 22/068
                                                         361/103

FOREIGN PATENT DOCUMENTS

CN      104267319         1/2015
CN      104301689         1/2015
CN      104301689  A      1/2015
CN      104330985         2/2015
CN      104330985  A      2/2015
CN      104866632         8/2015
CN      104866632  A      8/2015
CN      105633903         6/2016

OTHER PUBLICATIONS

Second Office Action for Chinese Patent Application No. 201610030684.9 dated Mar. 28, 2018.
International Search Report for PCT/CN2016/088586 dated Oct. 20, 2016.

* cited by examiner

ELECTRICAL DEVICE WITH FAILURE MONITORING FUNCTION, ELECTRICAL SYSTEM AND TERMINAL DEVICE

RELATED APPLICATIONS

The present application is the U.S. national phase entry of PCT/CN2016/088586, with an international filing date of Jul. 5, 2016, which claims the benefit of Chinese Patent Application No. 201610030684.9, filed on Jan. 18, 2016, the entire disclosure of which is incorporated herein by reference.

FIELD OF THE INVENTION

The present disclosure relates to the field of failure monitoring technologies, and more particularly to an electrical device with failure monitoring function, an electrical system and a terminal device.

BACKGROUND

In daily life, people will come into contact with a variety of electrical devices, for example, household appliances used in the family such as air conditioner, television set, refrigerator, washing machine, tablet computer, and the like; displays used in the subway or public transport system; as well as various players, mobile phones and the like that can be carried on the person. During use of these electrical devices, they often fail for some reason, even failing during an early stage of use. For example, a black screen may occur in displays and mobile phones. Refrigerators and washing machines may not start up normally; and so on. After occurrence of these failure phenomena, it is usually required to examine and test the failed electrical device in order to obtain the cause of failure, or even required to make experiments to find the cause of failure, so as to repair the failed electrical device. For example, it may be required to dissect the hardware of an electrical device or simulate a failure phenomenon. Apparently, this solution to determine the cause of failure may be overly dependent on experience, and the process thereof may also be relatively cumbersome, resulting in low efficiency.

SUMMARY

In order to alleviate or mitigate the problem that it is difficult in the prior art to determine the cause of failure after a failure occurs in an electrical device, embodiments of the present invention propose an electrical device, an electrical system comprising the electrical device and a corresponding terminal device.

In one aspect, embodiments of the present invention provide an electrical device, comprising: a sensing unit for sensing operational data of the electrical device during its operation, the operational data including at least one selected from a group consisting of a voltage and a current for an electric component of the electrical device and a temperature of the electrical device during its operation; and a storage unit for storing the operational data so that a cause of failure is analyzed by means of the stored operational data when a failure occurs in the electrical device.

Further, the storage unit may further store time information synchronized with the operational data sensed by the sensing unit.

In another embodiment, the electrical device further comprises a control unit electrically connected to the sensing unit and the storage unit, the control unit stops operation of the electrical device when the operational data exceeds a corresponding threshold value.

Further, the sensing unit comprises a temperature sensor, and the control unit stops operation of the electrical device when a temperature sensed by the temperature sensor exceeds a first temperature threshold.

Further, the control unit activates operation of the electrical device when the temperature sensed by the temperature sensor is below a second temperature threshold.

According to another embodiment of the present invention, the electrical device may further comprise a communication unit capable of communicating with an external device such that the operational data stored in the storage unit can be transmitted to the external device.

According to a further embodiment of the present invention, the electrical device may further comprise a determination unit for determining whether the operational data from the sensing unit is experiencing a change or not, the storage unit only stores changed operational data.

Further, the electrical device may further comprise a calculation unit for calculating a variation value of corresponding operational data when the operational data changes; and a comparison unit for comparing the variation value of the corresponding operational data calculated by the calculation unit with a variation threshold. The storage unit only stores operational data whose variation value exceeds the variation threshold.

In another aspect, an embodiment of the invention provides an electrical system, comprising at least one electrical device described in the foregoing embodiments and a server, each electrical device is capable of communicating with a server to transmit operational data to the server.

Further, the electrical device may comprise a receiving unit for receiving from the server an instruction that instructs transmission of operational data; and a transmitting unit for transmitting the operational data to the server in response to receiving the instruction.

Embodiments of the present invention further provide a terminal device which can be used for receiving operational data from the electrical device described in the foregoing embodiments so as to analyze a cause of failure using received operational data when a failure occurs in the electrical device.

Further, the terminal device may comprise an analysis unit for analyzing the operational data received from the electrical device to obtain the cause of failure; and an output unit for outputting information indicative of the failure and the cause of failure.

In another embodiment, the terminal device may comprise a determination unit for determining whether corresponding operational data received from the electrical device is experiencing a change or not; in this case, the analysis unit only analyzes changed operational data.

Further, the terminal device may further comprise a calculation unit for calculating a variation value of the corresponding operational data when the operational data changes; and a comparison unit for comparing the variation value of the corresponding operational data calculated by the calculation unit with a variation threshold. In this case, the analysis unit only analyzes operational data whose variation value exceeds the variation threshold.

In a further embodiment, the terminal device may further comprise a memory in which a corresponding relationship between a variation in the operational data and a cause of failure is stored. The analysis unit determines the cause of failure based on the corresponding relationship.

The electrical device, electrical system or corresponding terminal device provided by the embodiments of the present invention lay a basis for analyzing the cause of failure of the electrical device in a convenient, fast manner and can improve the accuracy and efficiency of the failure cause analysis. In addition, it can provide a reference for improvement in future design of an electrical device.

BRIEF DESCRIPTION OF THE DRAWINGS

Embodiments of the present invention will be described below in more detail by way of non-limiting example with reference to the accompanying drawings to provide a thorough understanding of the principle and spirit of the present invention. It is to be noted that the features and structures shown in the drawings do not represent actual shapes and sizes of respective components and elements, but merely serve to explain the principles of embodiments of the present invention.

DETAILED DESCRIPTION OF THE EMBODIMENTS

Figure 1:
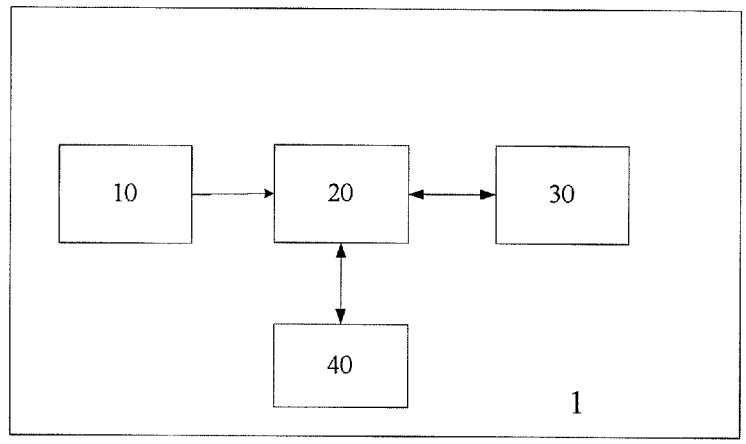
FIG. 1 schematically shows part of the constituent units included in an electrical device according to an embodiment of the present invention.

Specific embodiments of the invention will be described below in detail by way of examples. It is to be understood that the embodiments of the present invention are not limited to the examples enumerated below, and those skilled in the art can modify and vary the described embodiments by means of the principle or spirit revealed in the present disclosure to obtain other embodiments in different forms. Apparently, these embodiments all fall within the protection scope of the invention.

In addition, it is to be noted that, the drawings referred to herein are for the purpose of illustrating and explaining the embodiments of the invention, the drawings are not representative of the actual structure of an electrical device, and the connections between respective units as embodied in the drawings are merely used for illustrating the embodiments of the invention, which do not limit the scope of the present invention.

As mentioned above, the electrical device described herein is not limited to a particular device, which may be any currently available device that requires electrical energy to operate, for example, household appliances used in the family such as air conditioner, television set, refrigerator, washing machine, tablet computer, and the like; displays used in vehicles such as subway, public transport, aviation, ship, etc; portable devices that can be carried by personals, such as various players, mobile phones, and the like. In other words, the embodiments described below are applicable to these electrical devices.

FIG. 1 schematically shows part of the constituent units of an electrical device according to an embodiment of the invention. As shown in FIG. 1, in this embodiment, the electrical device 1 may comprise a sensing unit 10 for sensing operational data of the electrical device 1 during its operation, and a storage unit 30 for storing the operational data so that a cause of failure is analyzed by means of the stored operational data when a failure occurs in the electrical device. The operational data may include at least one selected from a group consisting of a voltage and a current for an electric component of the electrical device and a temperature of the electrical device during its operation.

The operational data sensed by the sensing unit 10 is not limited to this embodiment of the invention because the operational data to be sensed may vary with different particular electrical devices. For example, for an air conditioner, the operational data that can be sensed may include voltage, current and temperature, and may also include humidity, air supply volume, or a certain resistance value on the circuit board. Thus, the sensing unit 10 may be any sensor capable of sensing various operational data, for example, a voltage sensor, a current sensor, a temperature sensor, a humidity sensor, and the like. The electrical device 1 may comprise a plurality of different types of sensing units 10. In an embodiment, the sensing unit 10 may sense the voltages or currents associated with the electric components of the electrical device during operation, and particularly sense the voltage or currents for important electric components or easily damaged electric components of the electrical device. For example, for a display, the voltage at the driver board, the output current of the driver board, the temperature within the display, etc., may be sensed. Alternatively, the voltages at the motherboard, the power board and the backlight panel within the display may be sensed. Thus, the electric components whose operational data is sensed are not limited in embodiments of the invention, either. For different electrical devices, different electric components can be selected, for which operational data is to be sensed.

It is to be understood that the operational data sensed by the sensing unit 10 may be converted into digital values and stored in the storage unit 30 in the electrical device 1. For example, for the embodiment shown in FIG. 1, the operational data sensed or acquired by the sensing unit 10 may be converted into digital signals via an A/D converter (e.g., included in the controller 20) and then stored in the storage unit 30. The storage unit 30 may be any suitable storage medium, including, but not limited to, ROM, RAM, EEPROM, and the like.

In the embodiment of the invention, the sensing unit 10 may sense operational data associated with the electrical device 1 until the electrical device has failed, and the operational data may be stored in the storage unit 30 therein. Therefore, after the failure has occurred in the electrical device, the operational data stored in the storage unit can be used to analyze the possible cause of failure, which may provide a reference for improving the design of the electrical device. Compared with the prior art, by using these operational data, the cause of failure can be determined in a more convenient manner, and the efficiency of the maintenance of the failed electrical device is thus greatly improved.

In an embodiment, the storage unit may also store time information synchronized with the operational data sensed by the sensing unit. That is to say, the storage unit may record the operational data simultaneously with the time information at that time. In this way, during the process of possible failure cause analysis, the variation of corresponding operational data with time may be learned, such that the cause of failure can be determined more accurately and purposefully.

In another embodiment, protective measures may be taken for the electrical device based on the operational data sensed by the sensing unit to prevent the occurrence of failure. In this embodiment, the electrical device may further comprise a control unit electrically connected to the sensing unit and the storage unit, and the control unit may stop operation of the electrical device when the operational data exceeds a corresponding threshold.

Referring to FIG. 1 again, the control unit 20 may be electrically connected to the sensing unit 10 and the storage unit 30, and the control unit 20 may receive and process the operational data sensed by the sensing unit 10 and store it in the storage unit 30. When the controller 20 determines that a certain operational data exceeds a preset corresponding threshold, it can turn off the electrical device to protect the electrical device from failure or damage. For example, for a display, when it is detected that the output current of the driver board is too large and exceeds the corresponding threshold, the controller 20 can issue a control signal to turn off a switch in the power supply circuit of the driver board or the power supply circuit of the power board, such that the electrical device stops operating because of losing power, which prevents the driver board of the display from burning out.

According to a further embodiment of the invention, the sensing unit may comprise a temperature sensor. The control unit stops operation of the electrical device when the sensed temperature exceeds a first temperature threshold. An excessively high temperature may indicate that there may be a failure in the electrical device, or such excessively high temperature may be caused by some external reasons and present for a while. Preventing the electrical device from operating at excessively high temperatures can provide the electrical device with complete protection and extend the service life of electrical device. Further, the operation of the electrical device can be resumed after the temperature of the electrical device has dropped to a normal temperature. Therefore, in another embodiment, when the temperature sensed by the temperature sensor is lower than a second temperature threshold, the control unit activates the operation of the electrical device.

In another embodiment, the electrical device may comprise a communication unit capable of communicating with an external device so as to transmit the operational data stored in the storage unit to the external device. For example, referring to FIG. 1 again, the electrical device 1 may comprise a communication unit 40 such that the operational data stored in the storage unit 30 can be transmitted to an external device via the communication unit 40. Thus, the cause of failure may be analyzed on any suitable external device in a more convenient manner, without being necessarily limited to the electrical device. The communication unit 40 may include, but is not limited to, a USB interface, a Bluetooth interface, an infrared interface, a network interface, and the like.

Figure 2:
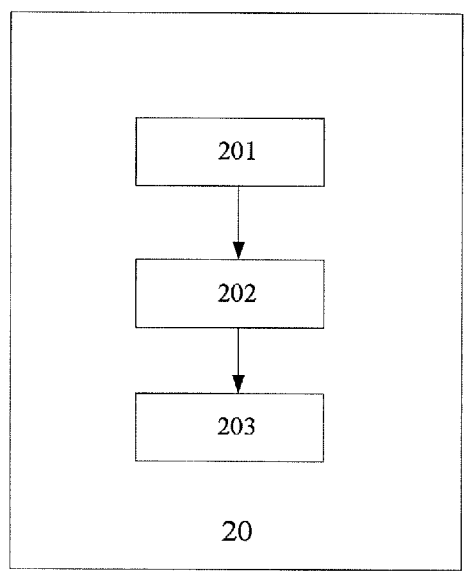
FIG. 2 schematically shows the constituent elements included in the controller of an electrical device according to another embodiment of the present invention.

According to a further embodiment of the invention, the electrical device may further comprise a determination unit for determining whether the operational data from the sensing unit is experiencing a change or not, the storage unit only stores changed operational data. Generally, the electrical device may operate in a normal state most of the time, and the operational data sensed by the sensing unit at that time does not indicate the failure state of the electrical device. Therefore, if all the operational data of the electrical device is stored until the electrical device has failed, the amount of data ultimately stored may be quite large, which may be cumbersome or inefficient for the failure cause analysis. Moreover, storing such a large amount of operational data also places higher requirements on the capacity of the storage unit, resulting in an increase in the cost. Accordingly, as shown in FIG. 2, the electrical device may further comprise a determination unit 201 for determining whether the operational data from the sensing unit is experiencing a change or not, and the storage unit only stores changed operational data. For example, the determination unit 201 may compare values of two consecutive operational data from the sensing unit, such that corresponding operational data having the same value may be excluded. The storage unit thus only stores changed operational data. These changed operational data may indicate the occurrence or presence of a failure. Although in FIG. 2, the determination unit 201 is included in the controller 20, in other embodiments the determination unit 201 may be located in other components of the electrical device or present as a separate component. Alternatively, the amount of data to be stored in the storage unit 30 may also be reduced in other ways, for example, the operational data within the storage unit of the electrical device is periodically overwritten, or the sensing unit only senses the operational data within a specified time period.

According to another embodiment of the invention, the electrical device may further comprise a calculation unit for calculating a variation value of corresponding operational data when the operational data changes, and a comparison unit for comparing the variation value of the corresponding operational data calculated by the calculation unit with a variation threshold. In this case, the storage unit may only store the operational data whose variation value exceeds the variation threshold. As shown in FIG. 2, the electrical device may further comprise a calculation unit 202 and a comparison unit 203. In case the determination unit 201 determines that the operational data changes, the calculation unit 202 may calculate a variation value of corresponding operational data, and the comparison unit 203 can compare the calculated variation value with the variation threshold, such that the operational data whose variation value exceeds the variation threshold is stored while other operational data is discarded. In this way, the amount of data to be stored in the storage unit can be further reduced, which facilitates simplification of the failure cause analysis and improves the efficiency of the failure cause analysis. In actual operation of the electrical device, even if no failure occurs, the operational data sensed by the sensing unit may change in a small range due to the influence of the environment. Therefore, using a reasonably selected variation threshold to filter out some operational data that may not indicate the failure of the electrical device can improve the efficiency of the failure analysis, while the possibility of omitting operational data associated with the failure can be minimized.

In some embodiments, the variation threshold may be dynamically adjusted depending on different types of operational data, the operating environment of the electrical device, and the remainder life of the electrical device. For example, after the electrical device has been used for a long time or when it is operated in a severe environment, the variation values of some operational data thereof in normal operating state may also increase. In this case, the corresponding variation threshold can be increased in order to further reduce the amount of operational data to be stored so as to facilitate the failure cause analysis.

The electrical devices described in the above embodiments of the present invention may constitute an electrical system, such as displays in a plurality of public transport vehicles or a plurality of display devices in the subway station or within the subway carriage. To facilitate monitoring of failure for these multiple electrical devices, operational data associated with each electrical device can be stored and managed in a centralized manner. Therefore, another embodiment of the invention provides an electrical system comprising at least one electrical device as described above and a server, each electrical device being capable of communicating with the server so as to transmit operational data to the server.

Figure 3:
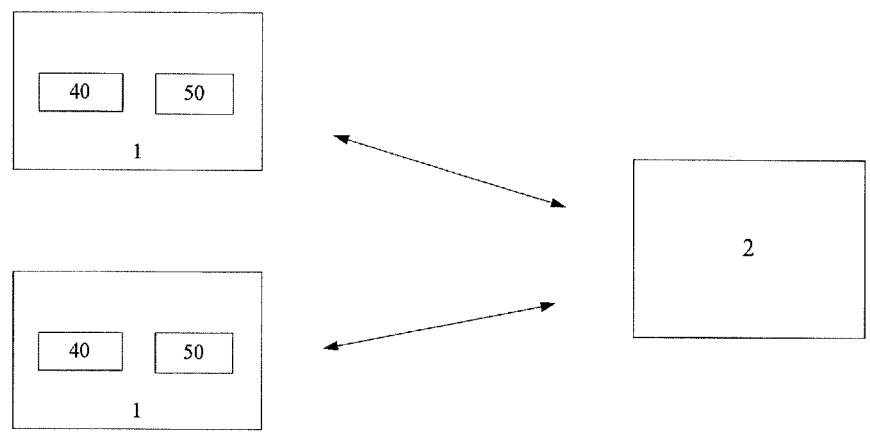
FIG. 3 schematically shows an electrical system comprising an electrical device according to an embodiment of the present invention.

FIG. 3 schematically shows two electrical devices 1 and a server 2, each electrical device 1 being capable of communicating with the server 2 for data transmission. The server 2 may send an instruction to each electrical device 1. Each electrical device 1 may comprise a receiving unit 40 for receiving from the server 2 an instruction that instructs transmission of operation data, and a transmitting unit 50 for transmitting the operational data to the server 2 in response to receiving the instruction. It is to be understood that the server 2 and each electrical device 1 may communicate with each other using any communication technology currently known to those skilled in the art, including wired and wireless communications. In this embodiment, all the operational data sensed by the electrical device 1 can be transmitted to the server 2 in real time or on a regular interval, without being processed on the electrical device 1. When a failure occurs in one or more electrical devices 1, the cause of failure can be analyzed on the server 2 using the relevant operational data.

With development and progress of the communication technology, data can be transmitted to and stored on any terminal device based on needs. Therefore, for a single electrical device, a terminal device matched thereto can be designed to receive and store operational data associated with the electrical device, so as to diagnose and analyze the cause of failure of the electrical device on the terminal device using the operational data, which may be particularly applicable to household electrical devices. Accordingly, embodiments of the invention further propose a terminal device for receiving operational data from the electrical device as described in the foregoing embodiments so as to analyze the cause of failure using the received operational data when the electrical device fails. The terminal device may be any electronic device having function of data transmission, including, but not limited to, a mobile phone, a tablet computer, a notebook computer, and the like.

Figure 4:
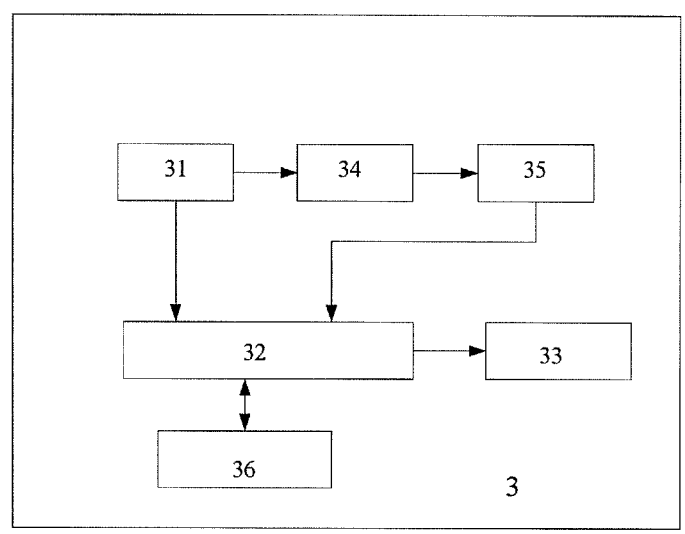
FIG. 4 schematically shows the constituent units of a terminal device according to an embodiment of the present invention.

In a further embodiment, the failure cause analysis function may be integrated into the terminal device and information about the cause of failure is provided via the terminal device when the electrical device fails. As shown in FIG. 4, in an embodiment, the terminal device 3 may comprise an analysis unit 32 for analyzing the operational data received from the electrical device 1 to determine the cause of failure, and an output unit 33 for outputting information indicative of the failure and the cause of failure. The analysis unit 32 may be a unit implemented in software, which may determine the cause of failure of the electrical device 1 by means of a failure cause analysis method or algorithm well known to those skilled in the art, and the output unit 33 may be a display unit that provides literal or other graphical or signal information.

It is to be understood that the functions corresponding to the determination unit, the calculation unit and the comparison unit described in the foregoing embodiments of electrical device may be integrated into the terminal device 3 to reduce the amount of operational data to be stored and analyzed by the terminal device 3, which facilitates the failure cause analysis for the electrical device. Therefore, in other embodiments, the terminal device may comprise a determination unit 31 for determining whether corresponding operational data received from the electrical device is experiencing a change or not. In this case, the analysis unit 32 may only analyze the changed operational data.

Further, the terminal device may further comprise a calculation unit 34 for calculating a variation value of corresponding operational data when the operational data changes, and a comparison unit 35 for comparing the variation value of the corresponding operational data calculated by the calculation unit 34 with a variation threshold. In this case, the analysis unit 32 may only analyze the operational data whose variation valve exceeds the variation threshold.

According to a further embodiment of the present invention, the terminal device 3 may further comprise a memory 36 in which a corresponding relationship between a variation in the operational data and a cause of failure is stored. In this embodiment, the analysis unit 32 may determine the cause of failure based on the corresponding relationship. This embodiment may provide an automated failure cause analysis system in which the terminal device can automatically provide the most likely cause of the failure without human intervention. The corresponding relationship between the variation in corresponding operational data and the cause of failure may be obtained by machine learning method. For example, some historical data may be provided for the terminal device 3 to learn, which includes not only the operational data sensed by the sensing unit of the electrical device but also the real data for the cause of failure that can be obtained from the maintenance personnel. By machine learning, it is possible to establish a corresponding relationship or model between the variation in the operational data and the cause of failure. On such basis, when a failure occurs in the electrical device, the terminal device 3 may automatically match the variation in the operational data to the cause of failure, thereby enhancing the accuracy of the failure detection and improving the efficiency of the failure cause analysis.

The electrical device, electrical system and corresponding terminal device provided by the above embodiments of the present invention lay a basis for analyzing the cause of failure for the electrical device in a convenient, fast manner and can improve the accuracy and efficiency of the failure cause analysis. Meanwhile, it can provide a reference for improvement in future design of an electrical device. For example, in case the sensed operational data indicates that certain switching element of the electrical device is often damaged by overcurrent, a switching element with a higher rated current can be selected for use in a future electrical device so as to improve the design for the electrical device.

Embodiments of the invention have been described above in detail with reference to the accompanying drawings. However, it is to be noted that the above embodiments are intended to illustrate rather than limit the invention and those skilled in the art will be able to design many alternative embodiments without departing from the scope of the appended claims. In the claims, the word "comprising" does not exclude elements or steps other than those stated in the claims, and the indefinite article "a" or "an" preceding an element does not exclude a plurality. The mere fact that certain measures are recited in mutually different dependent claims does not indicate that a combination of these measures cannot be used to advantage.

The invention claimed is:

1. An electrical device, comprising:
    a sensing unit for sensing operational data of the electrical device during its operation, wherein the operational data includes a voltage, a current for an electric component of the electrical device, a temperature of the electrical device during its operation, or combinations thereof;

a storage unit for storing the operational data so that a cause of failure is analyzed by means of the stored operational data when a failure occurs in the electrical device;

a determination unit for determining whether the operational data from the sensing unit is experiencing a change or not, and wherein the storage unit only stores changed operational data;

a calculation unit for calculating a variation value of corresponding operational data when the operational data changes, and a comparison unit for comparing the variation value of the corresponding operational data calculated by the calculation unit with a variation threshold, wherein the storage unit only stores operational data whose variation value exceeds the variation threshold.

2. The electrical device according to claim 1, wherein the storage unit further stores time information synchronized with the operational data sensed by the sensing unit.

3. The electrical device according to claim 1, wherein the electrical device further comprises a control unit electrically connected to the sensing unit and the storage unit, the control unit stops operation of the electrical device when the operational data exceeds a corresponding threshold value.

4. The electrical device according to claim 3, wherein the sensing unit comprises a temperature sensor, the control unit stops operation of the electrical device when a temperature sensed by the temperature sensor exceeds a first temperature threshold.

5. The electrical device according to claim 4, wherein the control unit activates operation of the electrical device when the temperature sensed by the temperature sensor is below a second temperature threshold.

6. The electrical device according to claim 1, wherein the electrical device further comprises a communication unit capable of communicating with an external device such that the operational data stored in the storage unit is transmitted to the external device.

7. An electrical system, comprising at least one electrical device and a server, wherein each electrical device is capable of communicating with the server to transmit operational data to the server, wherein the electrical device comprises:

a sensing unit for sensing operational data of the electrical device during its operation, the operational data including at least one selected from a group consisting of a voltage and a current for an electric component of the electrical device and a temperature of the electrical device during its operation;

a storage unit for storing the operational data so that a cause of failure is analyzed by means of the stored operational data when a failure occurs in the electrical device;

a determination unit for determining whether the operational data from the sensing unit is experiencing a change or not, the storage unit only stores changed operational data;

a calculation unit for calculating a variation value of corresponding operational data when the operational data changes, and a comparison unit for comparing the variation value of the corresponding operational data calculated by the calculation unit with a variation threshold, wherein the storage unit only stores operational data whose variation value exceeds the variation threshold.

8. The electrical system according to claim 7, wherein the electrical device further comprises:

a receiving unit for receiving from the server an instruction that instructs transmission of operational data, and a transmitting unit for transmitting the operational data to the server in response to receiving the instruction.

9. A terminal device, for receiving operational data from an electrical device so as to analyze a cause of failure using received operational data when a failure occurs in the electrical device, wherein the electrical device comprises:

a sensing unit for sensing operational data of the electrical device during its operation, the operational data including a voltage, a current for an electric component of the electrical device, a temperature of the electrical device during its operation, or combinations thereof; and a storage unit for storing the operational data so that a cause of failure is analyzed by means of the stored operational data when a failure occurs in the electrical device, wherein the terminal device comprises:

an analysis unit for analyzing the operational data received from the electrical device to obtain the cause of failure;

an output unit for outputting information indicative of the failure and the cause of failure; and a determination unit for determining whether corresponding operational data received from the electrical device is experiencing a change or not, wherein the analysis unit only analyzes changed operational data.

10. The terminal device according to claim 9, wherein the terminal device further comprises:

a calculation unit for calculating a variation value of corresponding operational data when the operational data changes, and a comparison unit for comparing the variation value of the corresponding operational data calculated by the calculation unit with a variation threshold, wherein the analysis unit only analyzes operational data whose variation value exceeds the variation threshold.

11. The terminal device of claim 10, wherein the terminal device further comprises a memory in which a corresponding relationship between a variation in the operational data and a cause of failure is stored, wherein the analysis unit determines the cause of failure based on the corresponding relationship.

12. The electrical system according to claim 7, wherein the storage unit further stores time information synchronized with the operational data sensed by the sensing unit.

13. The electrical system according to claim 7, wherein the electrical device further comprises a control unit electrically connected to the sensing unit and the storage unit, the control unit stops operation of the electrical device when the operational data exceeds a corresponding threshold value.

14. The electrical system according to claim 13, wherein the sensing unit comprises a temperature sensor, the control unit stops operation of the electrical device when a temperature sensed by the temperature sensor exceeds a first temperature threshold.

* * * * *